United States Patent
Izumi et al.

(10) Patent No.: US 11,887,826 B2
(45) Date of Patent: Jan. 30, 2024

(54) SEMICONDUCTOR MANUFACTURING APPARATUS AND EARTH SHIELD

(71) Applicant: Kioxia Corporation, Tokyo (JP)

(72) Inventors: Takashi Izumi, Yokkaichi (JP); Akitsugu Hatazaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/349,272

(22) Filed: Jun. 16, 2021

(65) Prior Publication Data
US 2022/0076934 A1 Mar. 10, 2022

(30) Foreign Application Priority Data

Sep. 8, 2020 (JP) ................................ 2020-150783

(51) Int. Cl.
*H01J 37/34* (2006.01)
(52) U.S. Cl.
CPC ...... *H01J 37/3441* (2013.01); *H01J 37/3435* (2013.01)
(58) Field of Classification Search
None
See application file for complete search history.

(56) References Cited

U.S. PATENT DOCUMENTS

| 6,197,165 B1* | 3/2001 | Drewery | H01J 37/32477 |
| | | | 204/192.12 |
| 2009/0321249 A1* | 12/2009 | Chistyakov | H01J 37/3423 |
| | | | 204/192.16 |
| 2014/0020629 A1* | 1/2014 | Tsai | H01J 37/3447 |
| | | | 118/728 |

FOREIGN PATENT DOCUMENTS

| JP | 6-295866 A | 10/1994 |
| JP | 2005-264177 | 9/2005 |
| JP | 3769238 B2 | 4/2006 |

* cited by examiner

*Primary Examiner* — Jason Berman
(74) *Attorney, Agent, or Firm* — Oblon, McClelland, Maier & Neustadt, L.L.P.

(57) ABSTRACT

A semiconductor manufacturing apparatus according to an embodiment includes a stage, a backing plate and an earth shield. The stage is configured to hold a substrate that a film is to be deposited on. The backing plate faces the stage and is configured such that a target containing a film deposition material is to be joined. The earth shield has an opening configured to enclose the target, and a plurality of through holes provided over a whole circumference of a circumferential part of the opening.

2 Claims, 5 Drawing Sheets

SEMICONDUCTOR MANUFACTURING APPARATUS AND EARTH SHIELD

CROSS-REFERENCE TO RELATED APPLICATIONS

This application is based upon and claims the benefit of priority from Japanese Patent Application No. 2020-150783, filed on Sep. 8, 2020; the entire contents of which are incorporated herein by reference.

FIELD

Embodiments of the present invention relate to a semiconductor manufacturing apparatus and an earth shield.

BACKGROUND

There is a plasma sputtering apparatus as one of semiconductor manufacturing apparatuses. The plasma sputtering apparatus generates plasma between a semiconductor substrate and a target. This plasma leads to ionization of noble gas such as argon, and ions of the noble gas collide with the target.

As a result, atoms fly out from the surface of the target to be deposited on the semiconductor substrate. Thereby, a film is deposited on the semiconductor substrate. In this stage, some of the atoms having flied out from the surface of the target are deposited also on an earth shield provided at a periphery of the target.

As the amount of film deposition on the semiconductor substrate is increasing, the amount of the target deposited on the earth shield is also increasing. There can be therefore a case where the plasma goes around and gets into between the earth shield and the target, which can cause another component other than the target to be sputtered.

DETAILED DESCRIPTION

Embodiments will now be explained with reference to the accompanying drawings. The present invention is not limited to the embodiments.

A semiconductor manufacturing apparatus according to an embodiment includes a stage, a backing plate, and an earth shield. The stage is configured to hold a substrate that a film is to be deposited on. The backing plate faces the stage and is configured such that a target containing a film deposition material is to be joined. The earth shield has an opening configured to enclose the target, and a plurality of through holes provided over a whole circumference of a circumferential part of the opening.

First Embodiment

Figure 1:
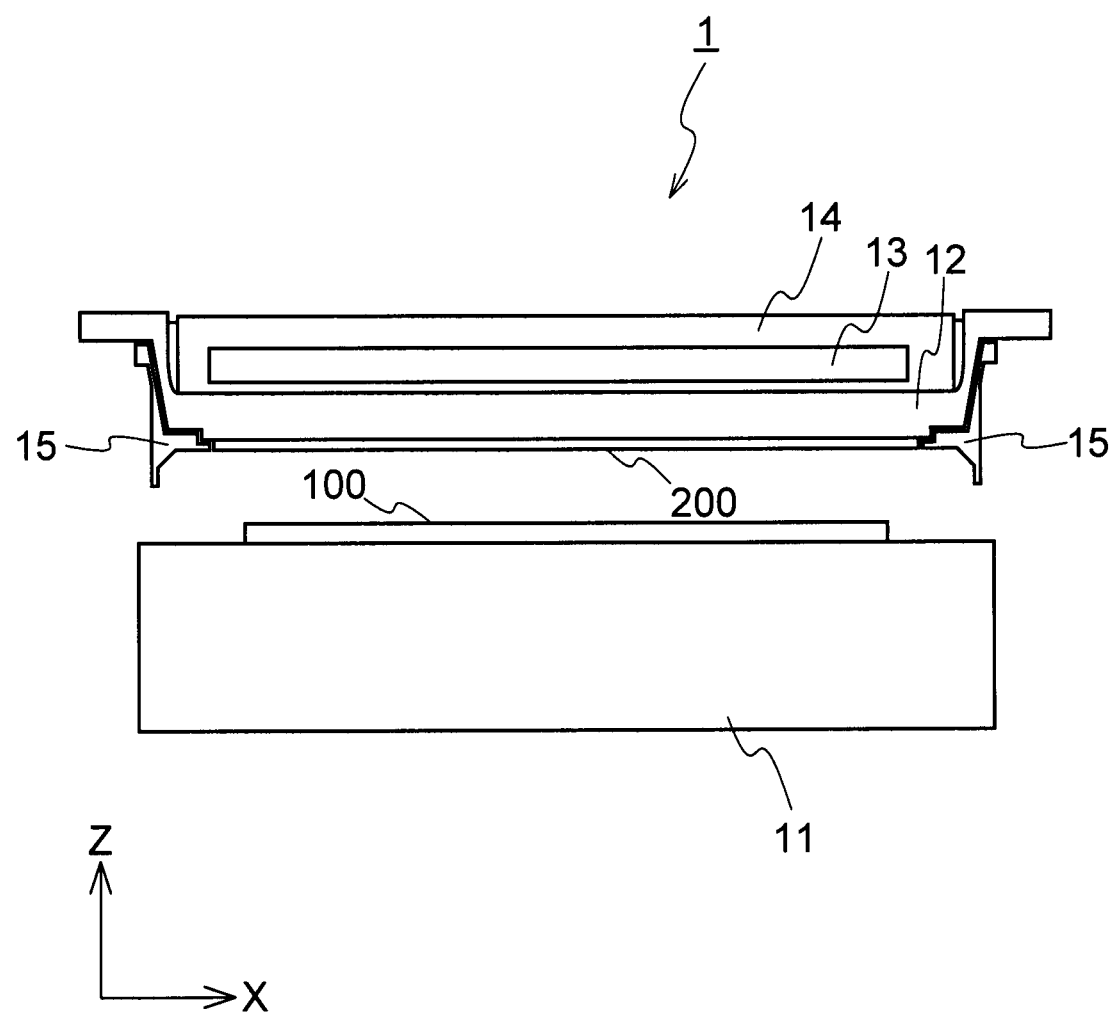
FIG. 1 is a schematic diagram schematically showing a configuration of a semiconductor manufacturing apparatus according to a first embodiment.

FIG. 1 is a schematic diagram schematically showing a configuration of a semiconductor manufacturing apparatus according to a first embodiment. A semiconductor manufacturing apparatus 1 shown in FIG. 1 is a plasma sputtering apparatus and includes a stage 11, a backing plate 12, a magnet 13, a cooling channel 14 and an earth shield 15.

On the stage 11, a semiconductor substrate 100 which a film is to be deposited on is placed. On the semiconductor substrate 100, for example, a conductive film or an insulating film is deposited.

The backing plate 12 faces the stage 11. A target 200 is joined to a bottom surface of the backing plate 12 (surface thereof facing the stage 11). The target 200 contains a material, for example, deposited as a film on the semiconductor substrate 100.

The magnet 13 is provided in the cooling channel 14. When a space between the stage 11 and the backing plate 12 is brought into a vacuum state and lines of magnetic force are emitted from the magnet 13, plasma is generated between the semiconductor substrate 100 and the target 200.

The cooling channel 14 is provided on an upper surface of the backing plate 12. Cooling water flows in the cooling channel 14. The backing plate 12 is cooled by this cooling water.

Figure 2:
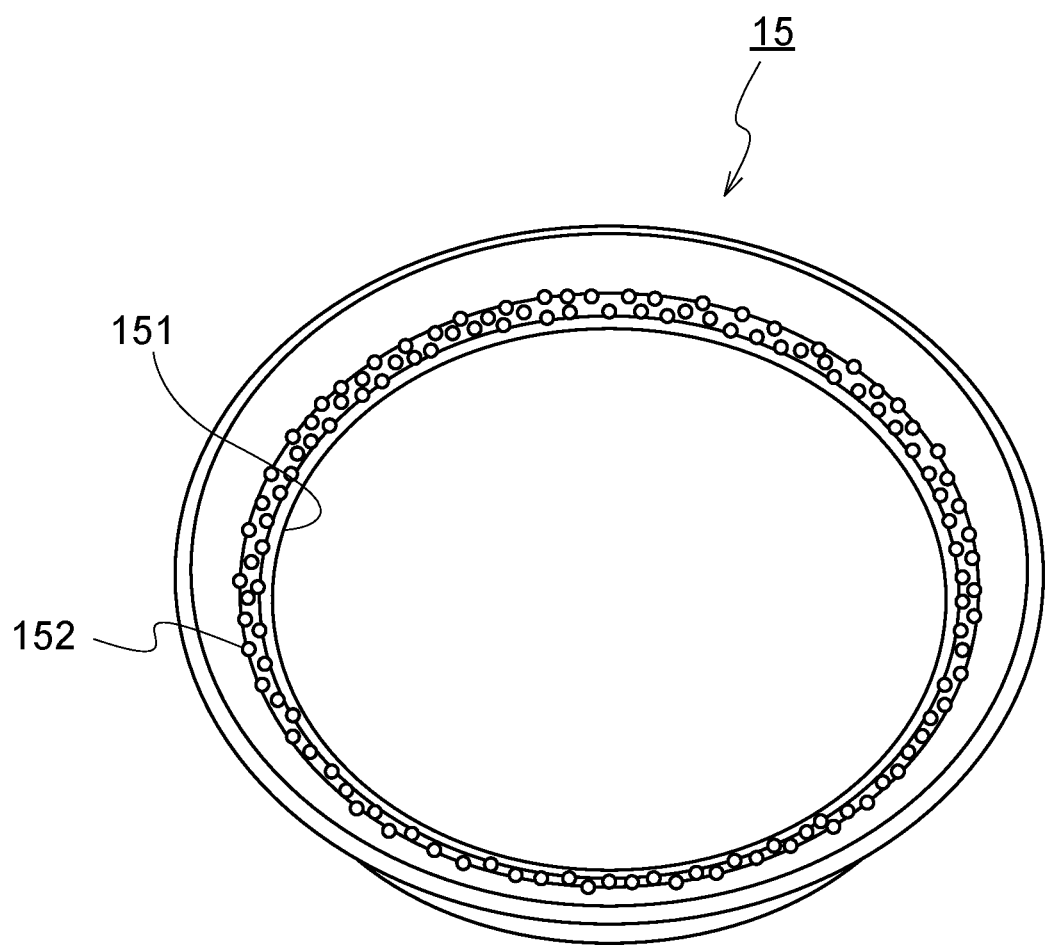
FIG. 2 is a perspective view of an earth shield.
Figure 3:
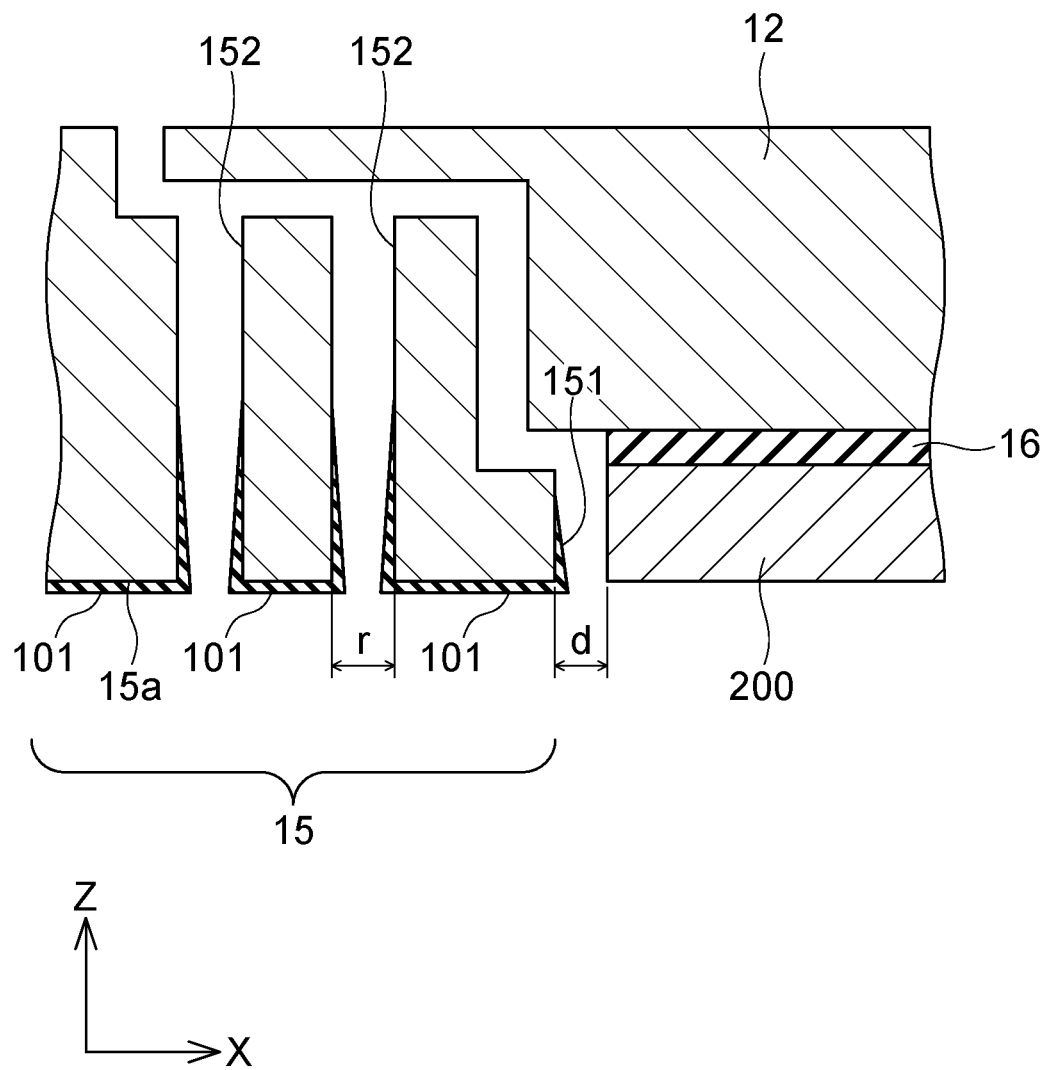
FIG. 3 is an enlarged cross sectional view of a boundary portion between a backing plate and an earth shield.

FIG. 2 is a perspective view of the earth shield 15. Moreover, FIG. 3 is an enlarged cross sectional view of a boundary portion between the backing plate 12 and the earth shield 15. Hereafter, a structure of the earth shield 15 is described with reference to FIG. 2 and FIG. 3.

The earth shield 15 is an annular member, for example, composed of stainless steel (SUS). The earth shield 15 has a bottom part recessed from its upper part. In this bottom part, an opening 151 and a plurality of through holes 152 are formed.

The opening 151 encloses the target 200. The plurality of through holes 152 are provided over the whole circumference of the circumferential part of the opening 151. As shown in FIG. 3, each through hole 152 extends in the Z-direction perpendicular to a bottom surface 15a of the earth shield 15. Moreover, the aperture diameter "r" of each through hole 152 is about 2 mm and is larger than the distance "d" between the target 200 and the opening 151.

Figure 4:
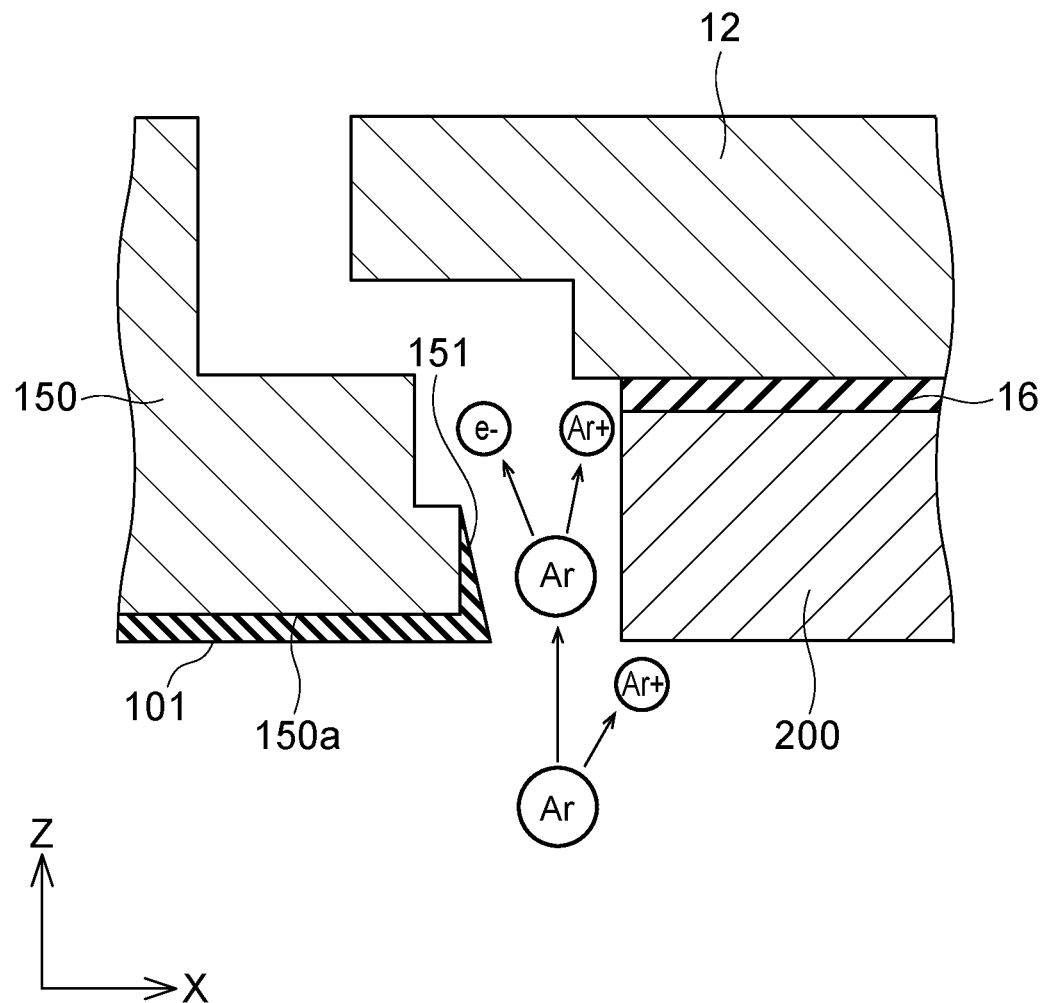
FIG. 4 is an enlarged cross sectional view of a boundary portion between a backing plate and an earth shield of a semiconductor manufacturing apparatus according to a comparative example.

FIG. 4 is an enlarged cross sectional view of a boundary portion between a backing plate and an earth shield of a semiconductor manufacturing apparatus according to a comparative example. The similar components thereof to those of the aforementioned semiconductor manufacturing apparatus 1 according to the first embodiment are given the same signs and their detailed description is omitted. The semiconductor manufacturing apparatus according to the present comparative example is different from the aforementioned semiconductor manufacturing apparatus 1 according to the present embodiment in that an earth shield 150 that the through holes 152 are not formed in is included.

In the case of film deposition on the semiconductor substrate 100 using each of the semiconductor manufacturing apparatus according to the comparative example and the semiconductor manufacturing apparatus 1 according to the present embodiment, noble gas such as argon (Ar) is introduced into the apparatus. When this noble gas is ionized with plasma generated by the magnet 13 and the like and collides with the target 200, atoms in the target 200 are flicked off.

The atoms having been flicked off are deposited on the semiconductor substrate 100, thereby, to form a film thereon.

In this stage, some of the atoms having been flicked off are deposited also on the earth shield 15, 150. Therefore, as the amount of film deposition is increasing, a film 101 is being formed on the bottom surface of each earth shield and on an inward circumferential surface, of the opening 151, that faces the target 200.

When this film 101 is, for example, an insulating film containing silicon nitride (SiN), with the semiconductor manufacturing apparatus according to the comparative example, a surface of the earth shield 150 results in being covered by the insulating film. There can be therefore a case where the plasma generated below the target 200 also goes around and gets into between the target 200 and the earth shield 150, and accordingly, argon ions (Ar$^+$) collide also with a bonding material 16 which joins the target 200 to the backing plate 12. In this case, there arises a possibility that sputtering of the bonding material 16 occurs and a film formed on the semiconductor substrate 100 is contaminated with atoms in the bonding material 16 as a foreign matter.

On the other hand, in the semiconductor manufacturing apparatus 1 according to the present embodiment, as shown in FIG. 3, the plurality of through holes 152 are formed in the earth shield 15. Therefore, since a ground potential is sufficiently secured at the earth shield 15, the plasma scarcely goes around or gets into between the target 200 and the earth shield 150. Therefore, the bonding material 16 can be prevented from sputtering.

Consequently, according to the present embodiment, when an insulating film is deposited on the semiconductor substrate 100, a film deposition property regarding the foreign matter contamination can be improved. Moreover, since in the present embodiment, the aperture diameter "r" of each through hole 152 is larger than the distance "d" between the target 200 and the opening 151, the plasma can be made further scarcely go around or get into between the target 200 and the earth shield 150.

Second Embodiment

Figure 5:
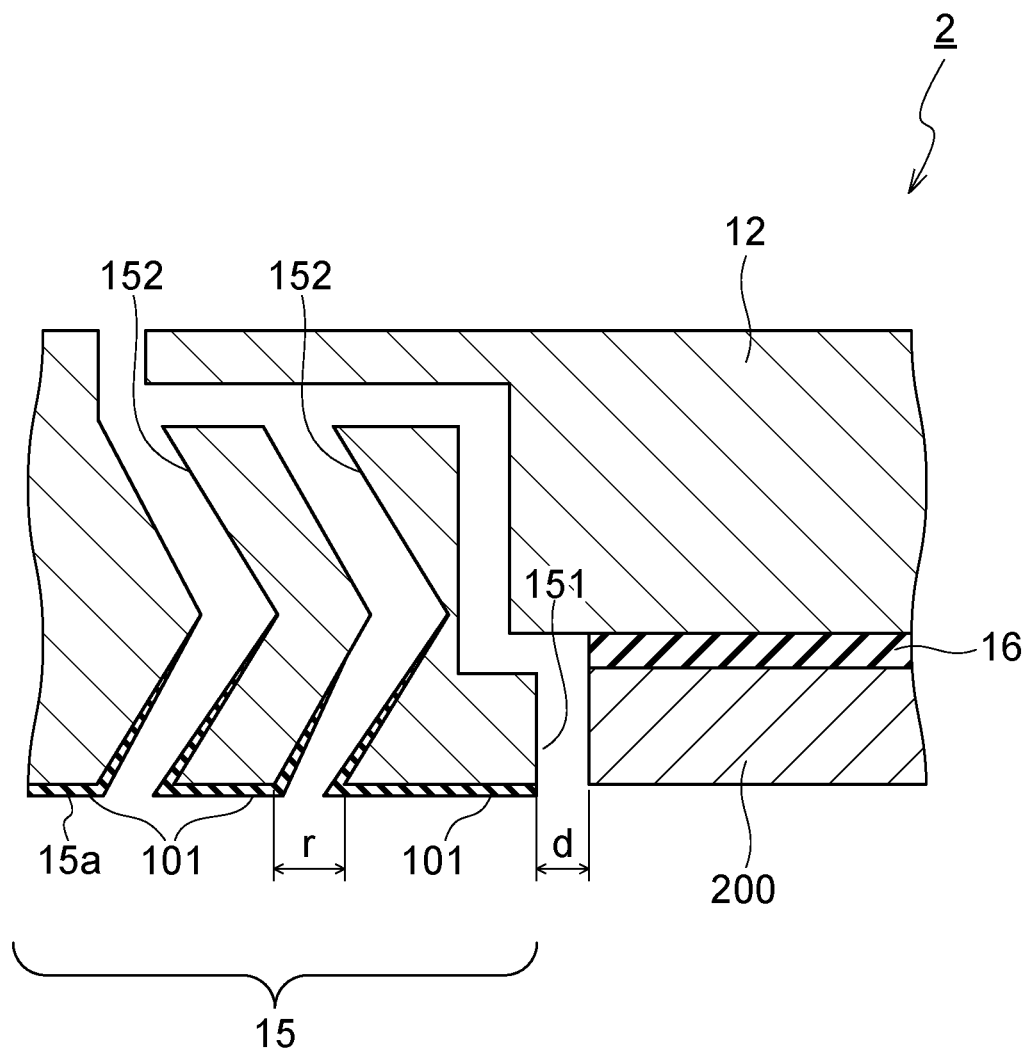
FIG. 5 is an enlarged cross sectional view of a boundary portion between a backing plate and an earth shield of a semiconductor manufacturing apparatus according to a second embodiment.

FIG. 5 is an enlarged cross sectional view of a boundary portion between a backing plate and an earth shield of a semiconductor manufacturing apparatus according to a second embodiment. The similar components thereof to those of the aforementioned semiconductor manufacturing apparatus 1 according to the first embodiment are given the same signs and their detailed description is omitted. A semiconductor manufacturing apparatus 2 according to the present embodiment is different in the shape of the through holes 152 from the semiconductor manufacturing apparatus 1 according to the first embodiment.

As shown in FIG. 5, in the present embodiment, each through hole 152 extends in an oblique direction to the bottom surface 15a of the earth shield 15. Specifically, each through hole 152 has a shape bending to the target 200 side.

The shape as above makes the film 101 more scarcely deposited in each through hole 152 than that in the first embodiment. Therefore, since the ground potential of the earth shield 15 can be readily secured, the plasma further scarcely goes around or gets into between the target 200 and the earth shield 15. As a result, the bonding material 16 is further restrained from sputtering.

Consequently, according to the present embodiment, when an insulating film is deposited on the semiconductor substrate 100, a film deposition property regarding the foreign matter contamination can be furthermore improved.

Notably, also in the present embodiment, the aperture diameter "r" of each through hole 152 is desirably larger than the distance "d" between the target 200 and the opening 151 in order to prevent the plasma from going around or getting into.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A plasma sputtering apparatus comprising:
   a stage configured to hold a substrate that a film is to be deposited on;
   a backing plate facing the stage and configured such that a target containing an insulating film deposition material is to be joined;
   an earth shield having an opening configured to enclose the target, and a plurality of through holes provided over a whole circumference of a circumferential part of the opening;
   a cooling channel provided on an upper surface of the backing plate; and
   a magnet provided in the cooling channel, wherein
   the plurality of through holes extend in an oblique inward to a bottom surface of the earth shield, and
   an aperture diameter of the plurality of through holes is larger than a distance between the target and the opening.

2. The plasma sputtering apparatus according to claim 1, wherein the plurality of through holes bend to the target side.

* * * * *